United States Patent
Kucic

(10) Patent No.: US 7,719,895 B2
(45) Date of Patent: May 18, 2010

(54) ALWAYS-EVALUATED ZERO STANDBY-CURRENT PROGRAMMABLE NON-VOLATILE MEMORY

(75) Inventor: Matthew R. Kucic, Santa Clara, CA (US)

(73) Assignee: Gtronix, Inc., Fremont, CA (US)

( * ) Notice: Subject to any disclaimer, the term of this patent is extended or adjusted under 35 U.S.C. 154(b) by 43 days.

(21) Appl. No.: 12/042,851

(22) Filed: Mar. 5, 2008

(65) Prior Publication Data

US 2008/0219052 A1   Sep. 11, 2008

Related U.S. Application Data

(60) Provisional application No. 60/893,111, filed on Mar. 5, 2007.

(51) Int. Cl.
*G11C 11/34* (2006.01)
(52) U.S. Cl. .............................. 365/185.18; 365/185.05; 365/185.19
(58) Field of Classification Search .................. 365/226, 365/185.05, 185.1, 185.26, 185.29, 189.09, 365/185.18, 185.19
See application file for complete search history.

(56) References Cited

U.S. PATENT DOCUMENTS

| | | | | |
|---|---|---|---|---|
| 5,424,985 A | * | 6/1995 | McClure et al. | 365/194 |
| 5,587,603 A | * | 12/1996 | Kowshik | 257/316 |
| 5,754,471 A | * | 5/1998 | Peng et al. | 365/185.1 |
| 7,400,527 B2 | * | 7/2008 | Wang | 365/185.03 |

* cited by examiner

*Primary Examiner*—Anh Phung
*Assistant Examiner*—Tha-O Bui
(74) *Attorney, Agent, or Firm*—Mahamedi Paradice Kreisman LLP; William L. Paradice, III

(57) ABSTRACT

In an integrated circuit device, a continuous-output, zero-standby-current non-volatile storage cell is formed by P-MOS and N-MOS transistor elements coupled in series between first and second power supply nodes (e.g., $V_{DD}$ and ground) and having a shared floating gate. When a positive charge is stored on the shared floating gate, the N-MOS transistor is switched to a conducting state, coupling the common-drain output of the transistor elements to the more negative power supply node to output a first logic value, and when a negative charge is stored on the shared floating gate, the P-MOS transistor element is switched to a conducting state, coupling the common-drain output to the more positive power supply node to output a second logic value.

17 Claims, 3 Drawing Sheets

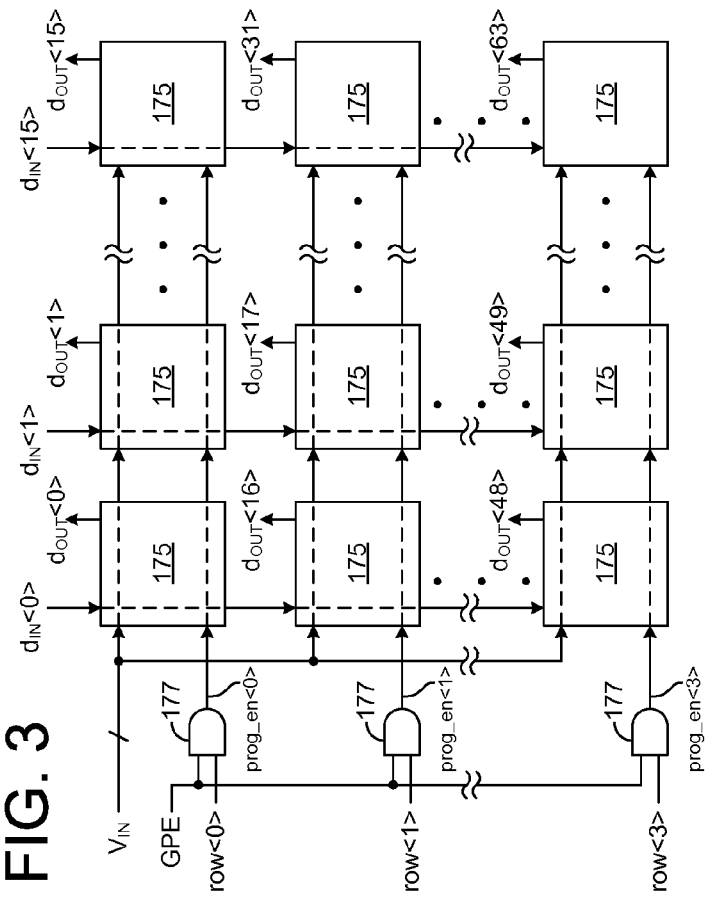
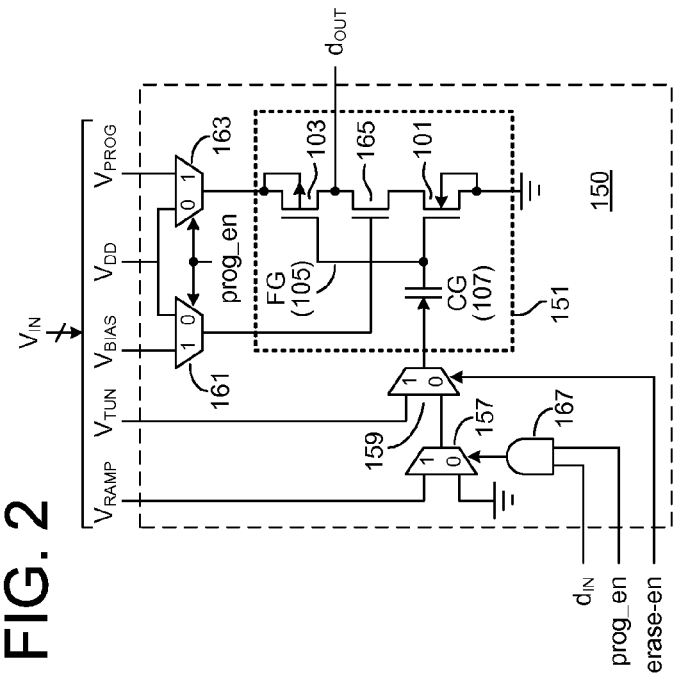

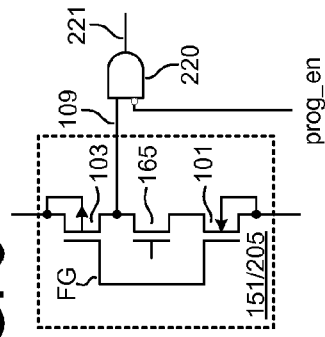
FIG. 6
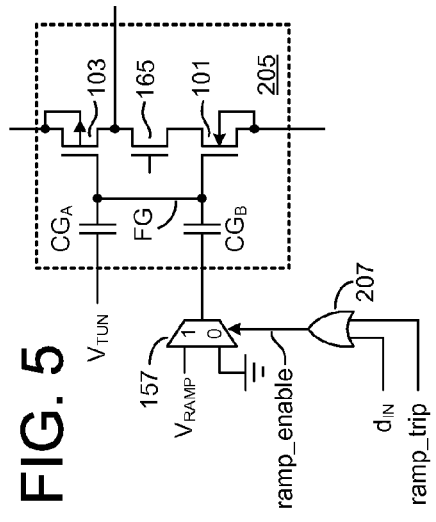
FIG. 5
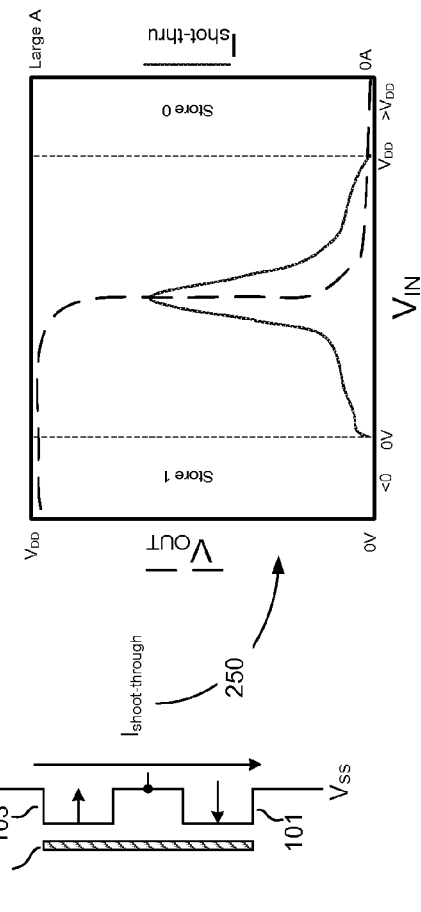
FIG. 8
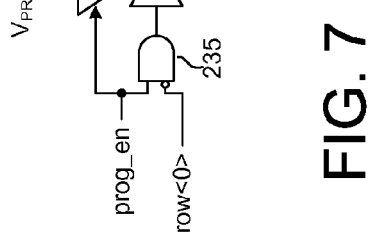
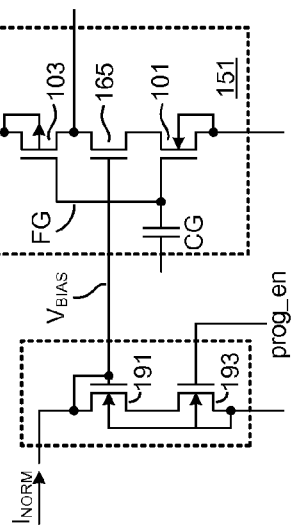
FIG. 4
FIG. 7

US 7,719,895 B2

ALWAYS-EVALUATED ZERO STANDBY-CURRENT PROGRAMMABLE NON-VOLATILE MEMORY

CROSS-REFERENCE TO RELATED APPLICATIONS

This application claims priority from, and hereby incorporates by reference, U.S. Provisional Application No. 60/893,111, filed Mar. 5, 2007 and entitled "Always-Evaluated Zero Standby-Current Programmable Non-Volatile Memory."

TECHNICAL FIELD

The disclosure herein relates to non-volatile data storage.

BACKGROUND

During a read operation in a conventional non-volatile storage cell, an operating current will flow through the cell for at least one of the two possible stored logic states. Assuming that collection of such cells within a register or array are accessed in parallel and that storage of a logic '1' is equally as likely as a logic '0', on average, half of all accessed cells will conduct current throughout a read operation. To avoid this undesired power consumption, non-volatile storage cells are generally read out only at certain events (e.g., power-up-reset) with their contents being copied into volatile memory elements (e.g., flip-flops or latches) that may be read continuously with negligible power consumption (i.e., without DC operating current). After the non-volatile data has been captured in volatile memory, the read operation within the non-volatile register or array is terminated to conserve power.

Unfortunately, the need for additional storage elements (i.e., the volatile storage elements) to make non-volatile data continuously available to downstream circuitry without power penalty requires circuit overhead and increased die size. Additionally, the non-volatile storage elements still consume substantial power during read operations. Further, additional circuits, such as sense-amplifiers and digital control circuitry, are typically required to retrieve data from the non-volatile storage cells and copy the data into the volatile counterparts. For example, the copy operation may require a state-machine and clock signals.

Another problem with the read-and-copy approach is that it delays the power-on-reset (POR) cycle, requiring circuitry for reading and copying the non-volatile data to be enabled and functional before the non-volatile data may be applied to control/configure analog or digital circuitry, generally meaning that such circuitry will not be available until after completion of the power-on-reset cycle. Worse, where the non-volatile data is needed for proper reset and/or initialization of analog or digital circuitry, an additional power-on-reset cycle (and corresponding circuitry for initiating and carrying out the additional POR) may be required, further delaying system readiness.

BRIEF DESCRIPTION OF THE DRAWINGS

FIG. 1 illustrates an embodiment of a continuous-output, zero-current non-volatile storage element;

FIG. 2 illustrates an embodiment of a continuous-output storage cell that includes voltage input nodes, control input nodes and a data input node to enable programming and erasure operations;

FIG. 3 illustrates an embodiment of a non-volatile storage array formed by multiple rows and multiple columns of continuous-output non-volatile storage cells;

FIG. 4 illustrates an embodiment of a bias voltage generator that may be used to generate the bias voltage applied to the gate of the biasing transistor within the floating-gate inverter structure of a continuous output storage cell;

FIG. 5 illustrates an embodiment of a floating-gate inverter structure that may form the storage element of a continuous-output non-volatile storage cell and that has separate control gates for erasure and programming operations;

FIG. 6 illustrates a portion of a continuous-output non-volatile storage cell in which the data output is gated by the program-enable signal, thus forcing the data output to a known state during programming operations;

FIG. 7 illustrates a portion of a continuous-output storage cell that includes a selectively powered inverter for coupling either the program voltage, $V_{PROG}$, or the supply voltage, $V_{DD}$, to the source terminal of P-MOS transistor element;

FIG. 8 illustrates floating-gate charge levels that may be used to ensure zero or negligible shoot-through current.

DETAILED DESCRIPTION

Figure 9:
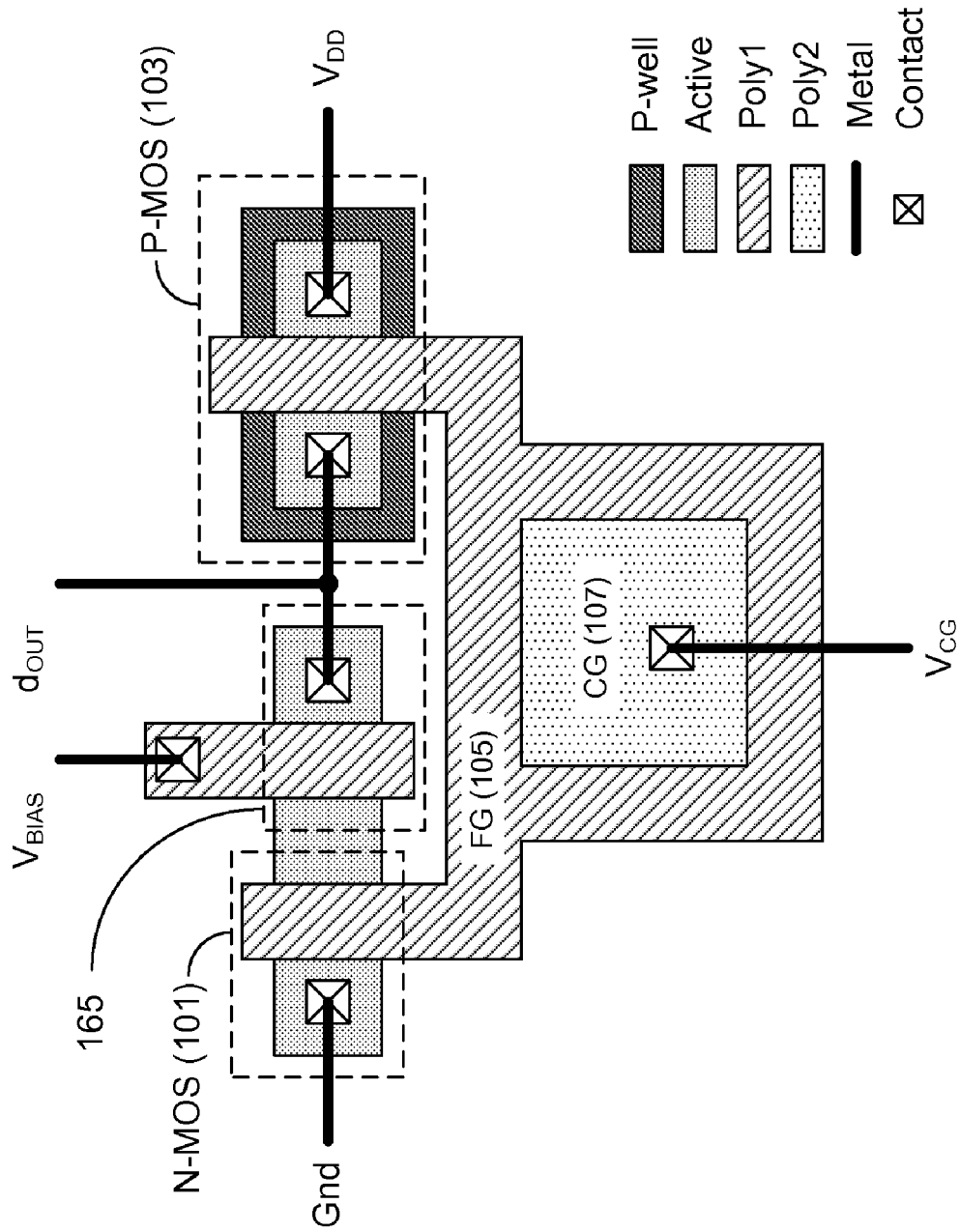
FIG. 9 illustrates an exemplary physical layout of a continuous-output non-volatile storage cell.

Non-volatile storage elements having a continuous output ("always on" or "always evaluated") with negligible power consumption are disclosed herein in various embodiments. In one embodiment, a non-volatile storage element includes P-MOS (P-type Metal Oxide Semiconductor) and N-MOS transistor elements that share a common floating gate and control gate and that are coupled drain-to-drain between positive and negative supply voltage nodes (e.g., $V_{DD}$ and Ground), in effect forming an inverter structure having an output voltage (i.e., voltage at the drain nodes of the P-MOS and N-MOS transistors) controlled by the charge programmed onto (or erased from) the floating gate. More specifically, when a sufficiently negative charge is established on the floating gate, the P-MOS transistor element is switched to a conducting state, coupling the positive supply node to the common-drain output node, and thus outputting a logic high (referred to herein as a logic '1') signal, and when a sufficiently positive charge is established on the floating gate, the N-MOS transistor element is switched to a conducting state, coupling the negative supply node to the common-drain output node to output a logic low (logic '0') signal. The output node itself may be supplied to the high impedance input of a downstream logic gate or high-impedance bias input of an analog component so that negligible current is drawn from the output of the storage cell, regardless of the logic state output by the storage cell.

One or more always-evaluated storage cells (i.e., continuous-output, negligible-standby-current storage cell) may be applied in a component (e.g., an integrated circuit die) or system of components where the non-volatile bit or set of bits therein provide analog trim control (e.g., vernier) or digital or analog architecture adjustments, such as architectural configuration control. As an example of an analog-trim application, the conversion levels in an analog-to-digital converter may need to be trimmed post-fabrication to compensate for systematic offset or other error. Similarly, corner frequencies in a filter may be adjusted post-fabrication based on off-chip factors or customer-specific requirements. For architecture adjustments, a virtually unlimited number of system parameters may be adjusted and/or various functional blocks in the component or system may be enabled, disabled, bypassed, etc. In all such cases, embodiments of continuous-output, zero-standby-current storage cells may be provided to enable the desired non-volatile setting to be programmed and thereafter made available after every power cycle and before the completion of a power-on-reset (POR) event, thereby avoiding delayed power-on-reset and additional circuitry (e.g., for read-and-copy operation and/or multi-POR cycles as discussed above) required in prior-art approaches.

FIG. 1 illustrates an embodiment of a continuous-output, zero-current non-volatile storage element 100 formed by an N-MOS transistor element 101 and P-MOS transistor element coupled in series between positive and negative supply voltages ($V_{DD}$ and ground in this example) and having a shared floating gate 105 (FG) and shared control gate 107 (CG). In the particular embodiment shown, the source terminal and body of the N-MOS transistor element 101 are coupled to ground, and the source terminal and body of the P-MOS transistor element 103 are coupled to $V_{DD}$. By this arrangement, when the charge stored on the floating gate 105 establishes a floating-gate voltage less than ground (i.e., less than zero volts), the P-MOS transistor element 103 begins conducting (substantially shorting the P-MOS drain and source terminals), switchably coupling the $V_{DD}$ supply node to a data output node 109 ($d_{OUT}$) and thereby producing a logic high (logic '1') data output. Conversely, when the charge stored on the floating gate establishes a floating-gate voltage above $V_{DD}$, the N-MOS transistor element 101 begins conducting (substantially shorting the N-MOS drain and source terminals), switchably coupling the data output node 109 to ground and thereby producing a logic low (logic '0') data output. Thus, a logic '0' or logic '1' data output (according to the floating gate charge level) is continuously available at the data output. Further, when the data output node 109 is coupled to the high-impedance of a downstream circuit element (e.g., the gate terminal of a field-effect transistor in a logic element or trim input of an analog component), zero or no current is drawn via the data output node 109 so that the continuously output data state is provided with no power-consumption penalty (i.e., other than leakage, no standby or DC current is required to read the data state stored in the cell 100). Note that, in contrast to a more conventional floating-gate storage cell in which a read voltage is applied to the control gate (thus conditionally forming a channel to conduct current between source and drain terminals depending on the charge stored on the floating gate), no read voltage need be actively applied to the control gate 107 to produce a valid data output. Instead, the control gate 107 is used during erase and programming operations to establish a desired charge level on the floating gate 105 (and thus a desired data output state).

Reflecting on the circuit arrangement of FIG. 1A, it can be seen that the P-MOS and N-MOS transistor elements form an inverter structure with a shared floating gate, a construct that may be viewed, as shown in FIG. 1B, as an inverter 120 with a voltage input determined by the charge level stored on a capacitive element 121 (which represents the floating gate 105 of FIG. 1A), and thus generating a continuous, zero-standby-current output that is the logical complement of the voltage represented by the stored charge level. FIG. 1C is a truth table illustrating the data output produced in the storage cell of FIG. 1A according to the floating gate charge level (logic '1' data output when a charge level below zero volts is stored, logic '0' data output when a charge level greater than $V_{DD}$ is stored).

FIG. 2 illustrates an embodiment of a continuous-output storage cell 150 that includes supply, program and erase voltage nodes (to receive supply voltages, $V_{DD}$ and Ground; program voltages, $V_{PROG}$, $V_{BIAS}$ and $V_{RAMP}$; and erase voltage, $V_{TUN}$); control nodes to receive a program-enable signal and erase-enable signal (prog_en, erase_en); and a data input node to receive input data signal, $d_{IN}$). Within the cell, multiplexers 157, 159, 161 and 163 (or any other type of selector circuit) are provided to selectively couple the supply, program and erase voltages to various nodes of a floating-gate inverter structure 151 formed by transistor elements 101, 103 and 165, shared floating gate 105 and control gate 107. The P-MOS and N-MOS transistor elements 101 and 165 are coupled generally as described in reference to FIG. 1A (i.e., sharing the floating gate 105 and control gate 107), except that N-MOS transistor 165, referred to herein as the biasing-transistor, is coupled between the drain of the P-MOS transistor element 103 (which forms the data output of the cell) and the drain of the N-MOS transistor 101. During normal operation, the program-enable signal (prog_en) is low (indicating that programming is disabled), so that supply voltage, $V_{DD}$, is applied to the gate terminal of the biasing transistor 165 via multiplexer 161 and to the source terminal of P-MOS transistor element 103 via multiplexer 163, thus powering the inverter structure 151 with the $V_{DD}$ supply and rendering biasing transistor 165 transparent (i.e., essentially shorting the drain to source and thus coupling the drains of the floating-gate-controlled transistor elements 101 and 103 to effect, at least electrically, the configuration shown in FIG. 1A). The erase-enable signal is also low during normal operation (indicating that cell erasure is disabled) so that multiplexers 159 and 157 couple the ground node at an input of multiplexer 157 to the control gate 107 of the floating-gate inverter structure 151. In this configuration, the charge programmed onto (or erased from) the floating gate 105 determines the state of the data output at output node 109 as described in reference to FIG. 1A. That is, if a voltage below zero volts is established on the floating gate 105 (a state that results from an programming operation, as discussed below, and thus referred to herein as the programmed state), P-MOS transistor element 103 is switched to a conducting state, coupling $V_{DD}$ to the output node 109 to establish a logic '1' data output. If a voltage above $V_{DD}$ is established on the floating gate 105 (a state that results from a erase operation, as discussed below, and referred to herein as the erased state), N-MOS transistor element 101 is switched to a conducting state, coupling the output node to ground to establish a logic '0' data output. Thus, the cell(151) is programmed to a logic '1' and erased to a logic '0'.

Assuming that the cell is initially in an erased state (logic '0'), a programming operation is initiated by assertion of the program-enable signal (prog_en), which couples the relatively high programming voltage ($V_{PROG}$, which is at least higher than $V_{DD}$ and generally between 5 and 15 volts, though not limited to that range as the programming voltage is dependent on the fabrication process and possibly other factors) to the source terminal of P-MOS transistor element 103 via multiplexer 163, and couples the bias voltage ($V_{BIAS}$) to the gate of biasing transistor 165 via multiplexer 161. The program-enable signal is also logically ANDed with the input data signal ($d_{IN}$, the data state to be programmed) to conditionally select either the ramped voltage ($V_{RAMP}$) or ground to be coupled to the control gate 107 via multiplexers 157 and 159 (the erase-enable signal is low during a program operation, so that multiplexer 159 passes the output of multiplexer 157 to the control gate 107). More specifically, if the input data signal is high (i.e., logic '1'), then the output of AND gate 167 goes high (due to the high program-enable signal and high input data signal) to select $V_{RAMP}$ to be applied to the control gate 107. By this arrangement, as $V_{RAMP}$ is ramped (i.e., progressively increased) from an initial voltage to a progressively higher voltage, the increasingly positive voltage applied to the control gate 107 reaches a point at which the current flowing through device 103 is reduced below that of device 165. At this point the drain-to-source voltage across device 103 will increase to a level which permits Hot-Carrier Injection (HCI) to occur. The HCI will inject electrons onto the gate(via 103) and subsequently lower the floating-gate voltage (105). As the floating-gate voltage lowers due to the injected electrons the current through device 103 will increase, and the drain-to-source voltage will reduce due to the common drain amplifier configuration with device 165. The HCI will stop once this happens. The ramping of the control gate (107) increases the floating-gate voltage and allow this process to occur over and over again until the control gate voltage reaches $V_{PROG}$. When the ramp is completed (i.e., $V_{RAMP}$ has ramped to $V_{PROG}$) and the program-enable signal is deasserted, the control gate is returned to ground via multiplexer 157. The change of the control gate (107) from $V_{PROG}$ to ground couples onto the floating-gate (105) and results in a floating-gate voltage below ground, thus establishing the programmed state of the storage cell when the program-enable signal is deasserted (i.e., P-MOS transistor element 103 conducting $V_{DD}$ and to establish a logic '1' data output).

Still considering the programming operation, if the input data value is a logic '0', the output of logic AND gate 167 remains low, thus coupling the control gate 107 to ground instead of $V_{RAMP}$, and leaving the cell in an erased state. That is, because the erased state of the cell is itself a logic '0' output, no programming operation need be performed in response to a logic '0' input data signal. With the control gate 107 at ground the current through device 103 will always be greater than the current through device 165. Therefore, the drain-to-source voltage across device 103 will never become large enough to permit HCI of electrons onto the floating-gate 197.

In an erase operation, the erase-enable signal (erase_en) is asserted, coupling the relatively high erase voltage ($V_{TUN}$, typically 8-25 volts but not limited to that range as the exact tunneling voltage tends to be dependent on the fabrication process and possibly other factors) to the control gate 107 of the floating-gate inverter structure 151. The program-enable signal is deasserted during cell erasure so that $V_{DD}$ is applied to the source terminal of the P-MOS transistor element 103 and to the gate of the biasing transistor 165 (thus rendering the biasing transistor transparent). If substantial negative charge has been injected onto the floating gate 105 in a programming operation (i.e., electrons collected), the electric field produced by the high, positive erase voltage, $V_{TUN}$, induces electrons to tunnel across the oxide barrier between the floating gate 105 and the control gate 107, thus establishing a positive electric charge on the floating gate 105, and thereby restoring the storage cell 150 to the erased state in which N-MOS transistor element 101 conducts to couple GND to the output node 109 (effecting a logic '0' data output).

It should be noted that numerous changes may be made to the storage cell of FIG. 2 without departing from the scope of the present disclosure. For example, while a single control gate node is switchably coupled (vial multiplexers 157 and 159) to supply voltages, $V_{RAMP}$ and $V_{TUN}$, during program and erase operations, respectively, separate control gates may alternatively be provided for application of the $V_{RAMP}$ and $V_{TUN}$ voltages (obviating multiplexer 159). As another example, the $V_{RAMP}$, $V_{TUN}$ and/or any other of the supply voltages may be switched on and off as needed at locations outside the storage cell, potentially obviating one or more control signals (e.g., $V_{TUN}$ may be applied to an input of the storage cell only during an erase operation, so that the erase-enable signal may be omitted altogether. Also, while particular tunneling and charge-injection techniques have been described for erasing and programming the storage cell, any technique and supporting circuitry for establishing desired charge levels on the floating gate node may be employed in alternative embodiments. Further, while a single continuous-output storage cell is depicted in FIG. 2, many such storage cells disposed may be in a row, column or in both rows and columns (i.e., an array) to enable non-volatile storage of one or more continuous-output, multi-bit data values.

FIG. 3 illustrates an embodiment of a non-volatile storage array 170 formed by four rows of continuous-output non-volatile storage cells 175, with each row including sixteen storage cells. In general, the storage cells 175 are constructed and operate in the same manner as storage cell 150 of FIG. 2 (all receiving the input voltages, $V_{IN}$, which include $V_{RAMP}$, $V_{TUN}$, $V_{BIAS}$, $V_{DD}$ and $V_{PROG}$), except that the erase supply voltage, $V_{TUN}$, is switched on or off at a source outside the array 170, and separate control gates are provided within each cell for erasure and programming, thus obviating the erase-enable signal. Further, a global program-enable signal, GPE, is logically ANDed (in logic AND gates 177) with a row-select signal for each row (i.e., row<0>, row<1>, etc.) to generate a row-wise program-enable signal (prog_en<0>, prog_en<1>, etc.) that is supplied to all the storage cells in a given row. By this arrangement, programming operations may be performed on one sixteen-bit row at a time, with the data value on a sixteen-bit data input port ($d_{IN}$<0>-$d_{IN}$<15>) being programmed within the row of storage cells for which the corresponding row-select signal is raised. By contrast, the erase supply voltage node is common to all storage cells in the array 170 so that, when $V_{TUN}$ is switched on, all the storage cells in the array are erased (i.e., restored to the erased state, if programmed) in a single erase operation. Also, in the particular embodiment shown, the data outputs of all the cells in the array ($d_{OUT}$<0>-$d_{OUT}$<63>) are provided on respective data output lines so that the entire 64 bits of the storage array are continuously output and available to control downstream digital and/or analog circuitry. Note that more or fewer rows and/or columns of storage cells may be provided in alternative embodiments, row-by-row erasure may be supported (and, conversely, simultaneous programming of the complete array may be supported), and an erase-enable signal may be provided to the storage cells to enable use of a shared control gate for erasure and programming operations, and so forth.

FIG. 4 illustrates an embodiment of a bias voltage generator 190 that may be used to generate the bias voltage applied to the gate of the biasing transistor 165 within the floating-gate inverter structure 151 of a continuous output storage cell (or array of such storage cells). In the embodiment shown, a normalizing current, $I_{NORM}$ (i.e., current source at a preset or programmatically or adaptively adjustable value), is supplied to the drain terminal of a diode-configured (i.e., coupled from gate to drain) N-MOS transistor 191. The source terminal of transistor 191 is coupled to ground through a bias-enable transistor 193 having a gate terminal coupled to receive the program-enable signal discussed above. The gate of transistor 191 is coupled in a current mirror arrangement with the gate terminal of the biasing transistor 165 within the floating-gate inverter structure 151. By this arrangement, when the program-enable signal is asserted, the bias-enable transistor is switched on and the normalizing current flows through transistor 191, thus developing a mirrored normalizing current, $I_{NORMX}$ (scaled according to any desired size scaling between transistor 191 and biasing transistor 165), within the biasing transistor 165. Other biasing arrangements may be employed in alternative embodiments.

FIG. 5 illustrates an embodiment of a floating-gate inverter structure 205 that may form the storage element of a continuous-output non-volatile storage cell and that has separate control gates for erasure and programming operations. In the embodiment shown, the erase supply voltage ($V_{TUN}$) is switched on or off outside the storage cell as discussed above, so that the erase supply voltage node may be coupled directly to a first control gate ($CG_A$) without need for a multiplexer or other switching circuit. Also, an additional control signal, ramp_trip, is logically ORed (in OR gate 207) with the input data signal ($d_{IN}$) to produce a ramp-enable signal (ramp_enable) that enables $V_{RAMP}$ to be applied to a second control gate ($CG_B$) whenever (i) the input data value is a logic '1' (thus enabling electrons to be collected on the floating gate as discussed) or (ii) the ramp-trip signal is asserted. In one embodiment, the ramp-trip signal is used to equalize (or normalize) the level of charge captured on the floating gate in the erased state, in essence, allowing some level of charge collection on (or injection onto) the floating gate to establish equal charge level on all erased storage cells of a register or array. Note that the program-enable signal may also be used to gate the ramp-enable signal, thus preventing $V_{RAMP}$ from being applied to the control gate ($CG_B$) at times other than programming operations. Alternatively, the program-enable signal may be applied only to control the voltage (selectively coupling $V_{DD}$ or $V_{PROG}$ to the source terminal of transistor element 103), thus preventing programming during non-programming operations, regardless of the voltage applied to control gate, $CG_B$.

FIG. 6 illustrates a portion of a continuous-output non-volatile storage cell (i.e., a portion of a floating-gate inverter structure) in which the data output at node 109 is gated by the program-enable signal (in AND gate 220), thereby forcing the data output at node 221 low (or to any known state) during programming operations and limiting possible perturbations of the floating-gate inverter structure (due to output current draw) during programming operations.

FIG. 7 illustrates a portion of a continuous-output storage cell that includes a selectively powered inverter 231 for coupling either the program voltage, $V_{PROG}$ (program with row selected), the supply voltage, $V_{DD}$ (run mode), or ground (row not selected) to the source terminal of P-MOS transistor element 103 (within a floating-gate inverter structure 205). In the embodiment shown, the program-enable signal (prog_en) is applied to a multiplexer 233 to select either $V_{PROG}$ or $V_{DD}$ to be applied to the power input of the inverter 231. The program-enable signal and row-select signal (the row<0> signal in this example) are logically combined in gate 235 to produce, except when program-enable is high and row-select is low, a logic low signal that is inverted by inverter 231 to provide the selected supply voltage, $V_{PROG}$ or $V_{DD}$, to the floating-gate inverter structure 205. When program-enable is high and row-select is low (signifying that a programming operation is being performed in another storage row), the output of gate 235 goes high, driving the output of inverter 231 to ground and thus preventing programming within the deselected row. In the embodiment shown, separate control gates, $CG_A$ and $CG_B$, are provided to support erasure and programming functions, though a single control gate may alternatively be multiplexed as described in reference to FIG. 2.

FIG. 8 illustrates floating-gate charge levels that may be used to ensure zero or negligible shoot-through current (i.e., current conducted by both the P-MOS and N-MOS transistor elements 103/101) in a continuous-output non-volatile storage cell. As shown in the plot of $I_{SHOOT-THROUGH}$ in graph 250, so long as the floating gate voltage is below zero volts (in an erased state) or above VDD (in a programmed state), zero or negligible shoot-through current is conducted, thus providing a continuously available logic output ($d_{OUT}$) with zero or negligible static current.

FIG. 9 illustrates an exemplary physical layout of a continuous-output non-volatile storage cell. As shown, a P-MOS transistor 103 element is formed by an active region disposed within a P-well (positively-doped well), and N-MOS transistor element 101 is formed by an active region disposed within the overall semiconductor substrate (the substrate in which the entire storage cell is formed). A biasing transistor 165 is formed within the same active region as the N-MOS transistor element 101 (thus coupling the two transistors source-to-drain), and includes a drain terminal coupled, via one or more metal layers, to a drain terminal of the P-MOS transistor element 103. The source terminals of the N-MOS and P-MOS transistor elements (101/103) are coupled respectively, via one or more metal layers, to ground and VDD (which coupling may be switchably effected as discussed above). A first polysilicon layer (Poly1) forms the floating gate and overlays the channels of the N-MOS and P-MOS transistor elements 101/103, thus completing a shared-floating-gate inverter structure which corresponds to structure 151 of FIG. 2. The first polysilicon layer also forms the gate of the biasing transistor 165 and a second polysilicon layer (Poly2) is disposed over (but insulated from) the first polysilicon layer to form a control gate 107. As discussed, one or more additional control gates may be provided, for example, to effect separate ports for programming and erase operations. Also, while a control gate formed by a second polysilicon layer is shown, control gate 107 (or a second control gate or both) may alternatively be formed by an active region disposed beneath and insulated from the floating gate. More generally, any capacitive element may be used to implement the control gate 107 or multiple control gates. Also, while a specific cell geometry and fabrication process is depicted, numerous other cell geometries and any integrated-circuit fabrication process (including processes using partially or completely different materials) may be used in alternative embodiments.

It should be noted that the various circuits disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and VHDL, formats supporting register level description languages like RTL, and formats supporting geometry description languages such as GDSII, GDSIII, GDSIV, CIF, MEBES and any other suitable formats and languages. Computer-readable media in which such formatted data and/or instructions may be embodied include, but are not limited to, non-volatile storage media in various forms (e.g., optical, magnetic or semiconductor storage media) and carrier waves that may be used to transfer such formatted data and/or instructions through wireless, optical, or wired signaling media or any combination thereof. Examples of transfers of such formatted data and/or instructions by carrier waves include, but are not limited to, transfers (uploads, downloads, e-mail, etc.) over the Internet and/or other computer networks via one or more data transfer protocols (e.g., HTTP, FTP, SMTP, etc.).

When received within a computer system via one or more computer-readable media, such data and/or instruction-based expressions of the above described circuits may be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process.

In the foregoing description and in the accompanying drawings, specific terminology and drawing symbols have been set forth to provide a thorough understanding of embodiments of the invention. In some instances, the terminology and symbols may imply specific details that are not required to practice the invention. For example, any of the specific numbers of bits, signal path widths, signaling or operating frequencies, component circuits or devices and the like may be different from those described above in alternative embodiments. Also, the interconnection between circuit elements or circuit blocks shown or described as multi-conductor signal links may alternatively be single-conductor signal links, and single conductor signal links may alternatively be multi-conductor signal links. Signals and signaling paths shown or described as being single-ended may also be differential, and vice-versa. Similarly, signals described or depicted as having active-high or active-low logic levels may have opposite logic levels in alternative embodiments. Component circuitry within integrated circuit devices may be implemented using metal oxide semiconductor (MOS) technology, bipolar technology or any other technology in which logical and analog circuits may be implemented. With respect to terminology, a signal is said to be "asserted" when the signal is driven to a low or high logic state (or charged to a high logic state or discharged to a low logic state) to indicate a particular condition. Conversely, a signal is said to be "deasserted" to indicate that the signal is driven (or charged or discharged) to a state other than the asserted state (including a high or low logic state, or the floating state that may occur when the signal driving circuit is transitioned to a high impedance condition, such as an open drain or open collector condition). A signal driving circuit is said to "output" a signal to a signal receiving circuit when the signal driving circuit asserts (or deasserts, if explicitly stated or indicated by context) the signal on a signal line coupled between the signal driving and signal receiving circuits. A signal line is said to be "activated" when a signal is asserted on the signal line, and "deactivated" when the signal is deasserted. Additionally, the prefix symbol "/" attached to signal names indicates that the signal is an active low signal (i.e., the asserted state is a logic low state). A line over a signal name (e.g., '<signalname>') is also used to indicate an active low signal. The term "coupled" is used herein to express a direct connection as well as a connection through one or more intervening circuits or structures. Integrated circuit device "programming" may include, for example and without limitation, loading a control value into a register or other storage circuit within the device in response to a host instruction and thus controlling an operational aspect of the device, establishing a device configuration or controlling an operational aspect of the device through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The term "exemplary" is used to express an example, not a preference or requirement.

While the invention has been described with reference to specific embodiments thereof, it will be evident that various modifications and changes may be made thereto without departing from the broader spirit and scope of the invention. For example, features or aspects of any of the embodiments may be applied, at least where practicable, in combination with any other of the embodiments or in place of counterpart features or aspects thereof. Accordingly, the specification and drawings are to be regarded in an illustrative rather than a restrictive sense.

What is claimed is:

1. A non-volatile storage cell comprising:
   first and second transistor elements coupled in series between first and second power supply nodes;
   a floating gate disposed adjacent the first and second transistor elements to place either the first transistor element in a conducting state or the second transistor element in a conducting state according to a level of charge stored on the floating gate; and
   a biasing transistor coupled between the drain terminals of the first and second transistor elements, the biasing transistor including a gate terminal to receive a selectable input voltage;
   wherein the biasing transistor is selectively coupled to either a bias voltage node or the first power supply node according to the state of a first control signal.

2. The non-volatile storage cell of claim 1 wherein the first transistor element comprises a P-MOS transistor element and the second transistor element comprises a N-MOS transistor element.

3. The non-volatile storage cell of claim 1 wherein source terminals of the first and second transistor elements are coupled to the first and second power supply nodes, respectively, and wherein drain terminals of the first and second transistor elements are coupled to one another to form a data output node of the non-volatile storage cell.

4. The non-volatile storage cell of claim 1 wherein the first and second transistor elements are formed within a semiconductor substrate, and wherein the non-volatile storage cell further comprises a first control gate disposed adjacent the floating gate to aid in transferring charge between the floating gate and either the control gate or the semiconductor substrate.

5. The non-volatile storage cell of claim 4 wherein the first control gate is switchably coupled to an erase-voltage node to aid in transferring negative charge from the floating gate to the control gate during an erasure operation.

6. The non-volatile storage cell of claim 5 wherein the first control gate is coupled to a ramped voltage node to enable a voltage of the first control gate to be ramped between two different voltages during a cell programming operation.

7. The non-volatile storage cell of claim 6 wherein negative charge is transferred from the semiconductor substrate to the floating gate during the programming operation to establish a negative voltage, relative to the second supply voltage node, on the floating gate.

8. The non-volatile storage cell of claim 1 wherein the first and second transistor elements, together with the floating gate, constitute an inverter structure that outputs a data signal that is inverted relative to a voltage level of the floating gate.

9. A method of operation within a non-volatile storage cell, the method comprising:
   establishing, at a first time, a negative charge on a floating gate that extends adjacent P-MOS and N-MOS transistor elements, the negative charge switching the N-MOS transistor element to a non-conducting state and the P-MOS transistor element to a conducting state, the P-MOS transistor element being coupled between a logic-high voltage node and an output node of the non-volatile storage cell;

establishing, at second time, a positive charge on the floating gate to switch the N-MOS transistor element to a conducting state and the P-MOS transistor element to a non-conducting state, the N-MOS transistor element being coupled between a logic-low voltage node and the output node of the non-volatile storage cell;

wherein establishing the negative charge on the floating gate further comprises establishing a controlled current flow through the P-MOS and N-MOS transistor elements, the controlled current flow comprises applying a selectable bias voltage to a biasing transistor coupled between drain terminals of the P-MOS and N-MOS transistor elements; and wherein the biasing transistor is selectively coupled to either a bias voltage node or the first power supply node according to the state of a first control signal.

10. The method of claim 9 wherein establishing the positive charge on the floating gate comprises switchably coupling a high positive voltage to a control gate of the non-volatile storage cell, the control gate being disposed adjacent the floating gate.

11. The method of claim 9 wherein establishing the negative charge on the floating gate comprises switchably coupling a ramped voltage source to a control gate of the non-volatile storage cell, the control gate being disposed adjacent the floating gate.

12. The method of claim 11 wherein establishing the negative charge on the floating gate further comprises applying a programming voltage source to a source terminal of the P-MOS transistor element.

13. The method of claim 9 further comprising driving the logic state of the output node to a predetermined state while establishing the positive charge on the floating gate.

14. A non-volatile storage cell comprising:

means for storing charge;

first means, disposed adjacent the means for storing charge, for coupling a first power supply node to an output node of the non-volatile storage cell in response to storage of a first charge level on the means for storing charge;

second means, disposed adjacent the means for storing charge, for coupling a second power supply node to the output node of the non-volatile storage cell in response to storage of a second charge level on the means for storing charge; and means for controlling current through the non-volatile storage cell;

wherein the means for controlling current is selectively coupled to either a bias voltage node or the first power supply node according to the state of a first control signal.

15. The non-volatile storage cell of claim 14 wherein the first and second power supply nodes comprise a supply voltage node and a ground reference node.

16. The non-volatile storage cell of claim 15 wherein the first charge level corresponds to a voltage on the means for storing charge that is lower than the nominal operating voltage of the ground reference node, and wherein the second charge level corresponds to a voltage on the means for storing charge that is higher than a nominal operating voltage of the supply voltage node.

17. A manufacture comprising one or more computer-readable media, the computer-readable media having information embodied therein that describes a physical implementation of a non-volatile storage cell within an integrated circuit device, the information including descriptions of:

first and second transistor elements coupled in series between first and second power supply nodes;

a floating gate disposed adjacent the first and second transistor elements to place either the first transistor element in a conducting state or the second transistor element in a conducting state according to a level of charge stored on the floating gate; and a biasing transistor coupled between the drain terminals of the first and second transistor elements, the biasing transistor including a gate terminal to receive a selectable input voltage;

wherein the biasing transistor is selectively coupled to either a bias voltage node or the first rower supply node according to the state of a first control signal.

* * * * *